United States Patent
Fink et al.

(10) Patent No.: US 11,193,984 B2
(45) Date of Patent: Dec. 7, 2021

(54) METHOD AND DEVICE FOR THE SERVICE LIFE-OPTIMIZED USAGE OF AN ELECTROCHEMICAL ENERGY STORE

(71) Applicant: SIEMENS AKTIENGESELLSCHAFT, Munich (DE)

(72) Inventors: Rafael Fink, Munich (DE); Kurt Majewski, Munich (DE); Martin Seydenschwanz, Munich (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 368 days.

(21) Appl. No.: 16/320,498

(22) PCT Filed: Jul. 28, 2016

(86) PCT No.: PCT/EP2016/068090
§ 371 (c)(1),
(2) Date: Jan. 25, 2019

(87) PCT Pub. No.: WO2018/019381
PCT Pub. Date: Feb. 1, 2018

(65) Prior Publication Data
US 2019/0265308 A1 Aug. 29, 2019

(51) Int. Cl.
*G01R 31/392* (2019.01)
*G01R 31/367* (2019.01)
(Continued)

(52) U.S. Cl.
CPC ......... *G01R 31/392* (2019.01); *G01R 31/367* (2019.01); *G01R 31/3648* (2013.01);
(Continued)

(58) Field of Classification Search
CPC .................................................. G01R 31/392
(Continued)

(56) References Cited

U.S. PATENT DOCUMENTS

| 6,456,988 B1* | 9/2002 | Singh | G01R 31/379 |
| | | | 706/2 |
| 2006/0208704 A1* | 9/2006 | Iwane | G01R 31/367 |
| | | | 320/132 |

(Continued)

FOREIGN PATENT DOCUMENTS

| DE | 102009024422 A1 | 1/2011 |
| DE | 102015205171 A1 | 9/2016 |

(Continued)

OTHER PUBLICATIONS

John Wang et al: "Cycle-life model for graphite-LiFePOcells", Journal of Power Sources, Elsevier SA, CH, d. 196, Nr. 8, Nov. 23, 2010 (Nov. 23, 2010), pp. 3942-3948, XP028359597, ISSN: 0378-7753, DOI: 10.1016/J.JPOWSOUR.2010.11.134; 2010.

(Continued)

*Primary Examiner* — Ricky Go
(74) *Attorney, Agent, or Firm* — Schmeiser, Olsen & Watts LLP

(57) ABSTRACT

A method for using an electrochemical energy storage device within a specifiable usage plan time period so as to optimize the service life is provided. The calendar aging constitutes a variable which influences the service life of the energy storage device and which is expressed in the form of a nonlinear function based on the fill state and the temperature of the energy storage device, the temperature being influencable by at least one charging and/or discharging process.

22 Claims, 5 Drawing Sheets

(51) Int. Cl.
  *G01R 31/382* (2019.01)
  *G01R 31/36* (2020.01)
  *H01M 10/48* (2006.01)
  *H01M 10/42* (2006.01)
  *H01M 10/44* (2006.01)
  *G01R 31/374* (2019.01)

(52) U.S. Cl.
  CPC .......... *G01R 31/382* (2019.01); *H01M 10/42* (2013.01); *H01M 10/48* (2013.01); *G01R 31/374* (2019.01); *H01M 10/44* (2013.01)

(58) Field of Classification Search
  USPC .......................................................... 702/63
  See application file for complete search history.

(56) References Cited

U.S. PATENT DOCUMENTS

| | | | | |
|---|---|---|---|---|
| 2015/0268307 A1* | 9/2015 | Inguva | ............... | G01R 31/3648 702/63 |
| 2015/0268308 A1* | 9/2015 | Nakayama | .............. | B60L 58/16 702/50 |
| 2017/0256004 A1* | 9/2017 | Hooshmand | ............ | G06F 1/263 |
| 2018/0076645 A1 | 3/2018 | Bamberger et al. | | |

FOREIGN PATENT DOCUMENTS

WO   2017178057 A1   10/2017
WO   WO 2017178057   10/2017

OTHER PUBLICATIONS

Keil P. et al: Aging of Lithium-Ion Batteries in Electric Vehicles: Impact of Regenerative Braking, EVS28 International Electric Vehicle Symposium and Exhibition, 2015.

Barre A. et al: A Review on Lithium-Ion Battery Ageing Mechanisms and Estimations for Automotive Application, Journal of Power Sources 241, pp. 680-689, 2013.

PCT International Search Report dated Dec. 2, 2016 and corresponding to PCT International Search Report No. PCT/EP2016/068090 filed on Jul. 28, 2016.

* cited by examiner

METHOD AND DEVICE FOR THE SERVICE LIFE-OPTIMIZED USAGE OF AN ELECTROCHEMICAL ENERGY STORE

CROSS-REFERENCE TO RELATED APPLICATIONS

This application claims priority to PCT Application No. PCT/EP2016/068090, having a filing date of Jul. 28, 2016, the entire contents of which are hereby incorporated by reference.

FIELD OF TECHNOLOGY

The following relates to a method and a device for the service life-optimized usage of an electrochemical energy store.

Moreover, the following relates to a computer program product and to a computer-readable medium.

BACKGROUND

In order to determine the service life and the associated economic benefit of an electrochemical energy store in an energy system, the aging of the energy store should be taken into account.

Energy stores such as batteries, for example, allow the generation and the consumption of electrical energy to be temporarily decoupled: if energy is available (favorably) at low-load times, the energy store should be charged. If energy is available only with cost expenditure at high-load times, the energy store should be discharged. Since the procurement of such chargeable and dischargeable energy stores is costly (currently more than 100 euros per kWh) and such energy stores are subject to chemical aging processes, operation or use of these energy stores which avoids expenditure and conserves resources is expedient in order to delay their aging as much as possible. A distinction can be drawn between calendrical (that is to say purely temporal) and cyclic (that is to say operation-dependent) aging.

PCT/EP2016/058281 has already proposed a method in which a non-linear function for determining the cyclic aging is linearly approximated in each of the time steps which are predefinable for the purpose of subdividing a predefinable usage planning period and is used to calculate a service life-optimized usage planning for using the energy store.

Furthermore, DE 102015205171.4 has already proposed a method for charging or discharging an electrochemical energy store which slows down the aging of the energy store by means of intelligent interruption of the charging or discharging cycles.

While cyclic battery aging is dependent on temperature and energy throughput, calendrical battery aging is crucially influenced by the temperature and the energy content or the state of charge of the battery (see [1, 2]).

Charging and discharging processes result in a temperature increase and a change in the state of charge, wherein an activation energy has to be overcome at the molecular level during the charging and/or discharging process of the energy store. The influence of temperature on aging is quantified by the Arrhenius law and can result in aging which is more than twice as fast in the case of a temperature increase by 10 degrees, for example. The temperature-dependent factor $f(T)$ is given by the Arrhenius law:

$$f(T) = \exp(-E_a/(R*T))$$

In this law, the activation energy $E_a$ and the universal gas constant R are known parameters, wherein these parameters depend on the chemistry of the energy store and are determined experimentally, if appropriate, and T is the temperature in kelvins.

The functional relationship between state of charge and calendrical aging is usually determined experimentally and possibly differs qualitatively in the case of batteries of different designs. The results from [2, chapter 4] show that in the case of lithium-ion batteries, average states of charge result in an intensified loss of capacity and thus shorten the lifetime.

The calendrical aging costs of the battery per hour at a temperature T in kelvins and given a state of charge SoC in percent can be quantified by the formula $$F(SoC,T) = h(SoC)*f(T) = C_{Bat}/(365*24*g(SoC))*\exp(M/T_{ref} - M/T) \quad (1)$$

wherein $h(SoC)$ describes the calendrical aging costs of the battery per hour and $C_{Bat}$ denotes the procurement costs of the battery. The formula $g(SoC)$ indicates the lifetime or service life of the battery in years depending on the state of charge, that is to say that at a reference temperature $T_{ref}$ experimentally a determination is made of when the loss of capacity of the battery exceeds a certain threshold value and thus renders it unusable. The procurement costs of the battery per operating hour are then subsequently multiplied by the formula $f(T)$, which quantifies the influence of temperature in accordance with the Arrhenius law. In this case, $M = E_a/R$ is the quotient of activation energy and universal gas constant in the Arrhenius law. This quotient is usually determined by measurements of the aging at two different temperatures.

Expedient usage of a battery necessitates weighing up time-dependent energy costs versus battery aging costs and should take into consideration here the physical limits and resulting state of charge and temperature profiles.

In many applications, the operational control of the use of the battery or energy store is optimized with the aid of mathematical methods. In particular, the mixed integer linear programming (MILP) method can be used in this case.

Linear optimization is concerned with optimizing linear target functions over a set which is restricted by linear equations and inequalities. It is the basis of the solution methods of (mixed) integer linear optimization (MILP). A so-called solver, such as e.g. CPLEX, Gurobi, is a collective term for special mathematical computer programs which can numerically solve mathematical optimization problems.

For MILP-based approaches for the service life-optimized usage planning for batteries, hitherto very greatly simplified battery models have mainly been used in order to reduce the complexity of the optimization problems which occur. However, the simplifications in the modeling of the batteries, which either completely disregard aging dynamics or inadequately simply them, often result in great discrepancies between the predicted performance and the actual performance of the battery with respect to the service life and the resulting costs.

SUMMARY

An aspect relates to a method or technique for the service life-optimized usage of an electrochemical energy store, which method or technique is improved by comparison with the prior art mentioned, wherein the calendrical aging of the energy store is intended to be taken into account.

The embodiments claim a method for the service life-optimized usage of an electrochemical energy store within a predefinable usage planning period, wherein the calendrical aging constitutes a variable which influences the service life of the energy store and which is expressed in the form of a non-linear function depending on the state of charge and the temperature of the energy store, which are able to be influenced by at least one charging and/or discharging process, characterized in that
a) a first step involves forming the logarithm of the non-linear function for determining the calendrical aging,
b) wherein a second step involves converting the logarithmic function formed, which is dependent on the arguments of state of charge and temperature, into an addition of a first logarithmic term, which is dependent on the state of charge, and a second logarithmic term, which is dependent on the temperature,
c) wherein a third step involves linearly approximating, in each case independently of one another, both logarithmic terms in each of the time steps which are predefinable for the purpose of subdividing the usage planning period,
d) wherein a fourth step involves calculating the non-linear function for determining the calendrical aging by applying the exponential function to the logarithm from the first step a),
e) wherein the steps mentioned yield a calculation of the calendrical aging for the service life-optimized usage planning by means of a sum over the predefinable time steps.

Carrying out the steps mentioned above ultimately yields the usage planning for the service life-optimized usage of the energy store.

Service life-optimized can also mean resource consumption-optimized, the resource relating to "energy store". A lower resource consumption generally entails an increased service life of the energy store.

In order to linearize the non-linear relationship with two arguments (state of charge and temperature), the non-linear function can be approximated by one or a plurality of straight lines.

Said one or said plurality of straight lines can be configured as regression straight lines.

The exponential function from the fourth step d) mentioned above can be piecewise linearly approximated. The number of segments for the linear approximation can be defined.

The first logarithmic term that is dependent on the state of charge and the second logarithmic term that is dependent on temperature can in each case be piecewise linearly approximated. The linear approximation of the logarithmic term that is dependent on temperature can be carried out by means of one or a plurality of straight lines.

Said one or said plurality of straight lines can be configured as tangential straight lines.

A state of charge of extremely fast calendrical aging can be determined, which is used as a support point for the piecewise linear approximation of the logarithmic term that is dependent on the state of charge.

Here the number of different straight lines can be defined in each case.

The usage planning period for the usage of the energy store can be predefined at 24 hours, for example. The predefinable time steps are generally discrete. By way of example, the usage planning period can be subdivided into time steps of 1 or 2 hours, wherein the time steps can be predefined by a user. The time steps can be temporarily equidistant.

A minimum and/or maximum state of charge of the energy store can influence the calculation as further variables, wherein these variables as threshold values ought not be undershot and/or exceeded.

In addition, a minimum and/or maximum temperature of the energy store can influence the calculation as further variables, wherein these variables as threshold values ought not be undershot and/or exceeded.

The embodiments contribute to determining charging and discharging periods of a battery and the electrical power used in the process whilst taking account of the calendrical aging dependent on the state of charge and temperature such that the service life and thus also the economic benefit of the battery are maximized. By virtue of the flexibility of the procedure according to the invention, the calendrical aging of batteries of different designs can be modeled using the same approach.

The usage planning for the service life-optimized usage can be determined by calculation by integer linear programming.

With regard to the direct utilization of the non-linear models mentioned above, this approach offers a greatly improved performance in complex, but run-time-critical applications with planning optimization at the run time.

The cyclic aging mentioned in the introduction can be used as a further variable for determining the usage planning for the service life-optimized usage of the energy store. This approach (calendrical aging) can thus be combined with the method from PCT/EP2016/058281 (cyclic aging) mentioned in the introduction.

A further aspect of embodiments of the invention provides a device for determining the service life-optimized usage of an electrochemical energy store within a predefinable usage planning period, wherein the calendrical aging constitutes a variable which influences the service life of the energy store and which can be expressed in the form of a non-linear function depending on the state of charge and the temperature of the energy store, which are able to be influenced by at least one charging and/or discharging process, wherein the device is designed
a) to form the logarithm of the non-linear function for determining the calendrical aging,
b) wherein the logarithmic function formed, which is dependent on the arguments of state of charge and temperature, can be converted into an addition of a first logarithmic term, which is dependent on the state of charge, and a second logarithmic term, which is dependent on the temperature,
c) wherein both logarithmic terms are linearly approximable, in each case independently of one another, in each of the time steps which are predefinable for the purpose of subdividing the usage planning period,
d) wherein the non-linear function for determining the calendrical aging is calculable by applying the exponential function to the logarithm from feature a) above,
e) wherein a calculation of the calendrical aging for the service life-optimized usage planning is able to be carried out by means of a sum over the predefinable time steps.

The device can provide means and/or units or apparatuses and/or modules for carrying out the abovementioned method which can be manifested in each case in the form of hardware and/or firmware and/or software or as a computer program that includes a computer readable hardware storage device having computer readable program code stored therein, said program code executable by a processor of a computer system to implement a method.

The device can be developed in a corresponding manner to the method described above.

Such a device can be an energy system or else an energy installation. The energy store can be part of an energy system or of an installation.

The installation can be characterized, inter alia, by one of the following installation types. Examples thereof are:
an energy generating installation, and
an energy network.

A further aspect of embodiments of the invention is a computer program product or a computer program comprising means for carrying out the abovementioned method when the computer program (product) is executed in an abovementioned device or in means of the device. The computer program or computer program product can be stored on a computer-readable medium. The computer program or computer program product can be created in a conventional programming language (e.g. C++, Java). The processing unit can comprise a commercially conventional computer or server having corresponding input, output, and storage means. This processing unit can be integrated in the device or in the means thereof.

BRIEF DESCRIPTION

Some of the embodiments will be described in detail, with references to the following Figures, wherein like designations denote like members, wherein.

DETAILED DESCRIPTION

Figure 1:
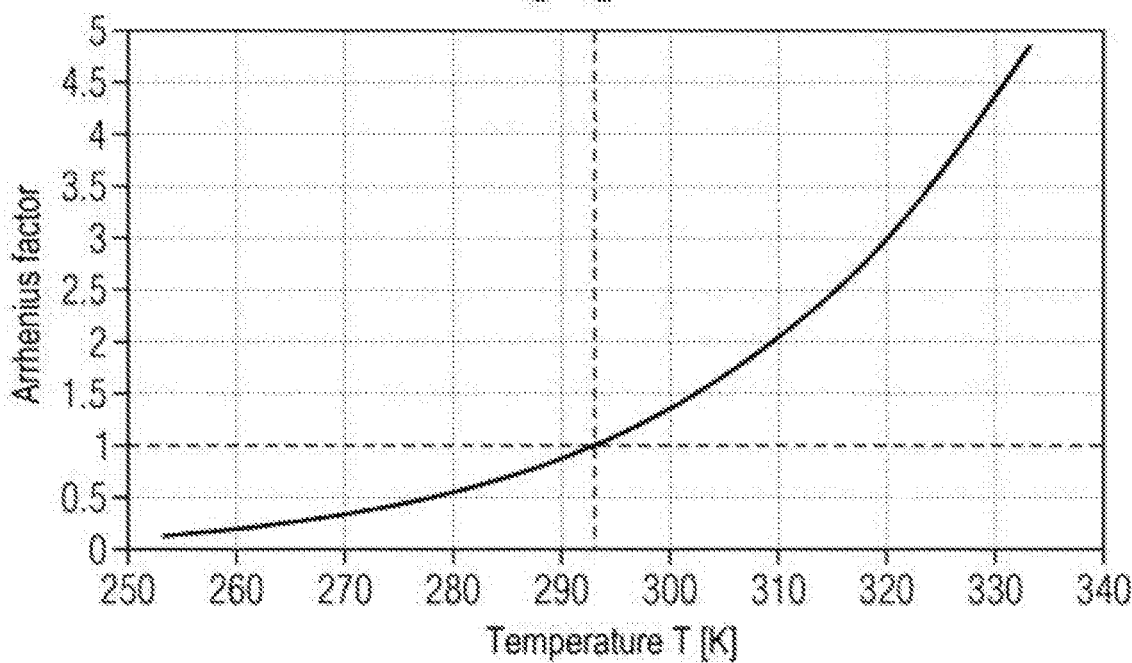
FIG. 1 shows an illustration of the Arrhenius law.

FIG. 1 illustrates the Arrhenius law, wherein the temperature in kelvins [K] is plotted on the x-axis of the diagram in FIG. 1 and the Arrhenius factor is plotted on the y-axis if the activation energy is $E_a=32\,000$ [J/mol] and the reference temperature is $T_{ref}=293.15$ [K].

Proceeding from (1), further important input variables of the battery are its minimum and maximum state of charge $SoC_{min}$ and $SoC_{max}$, respectively, in percent, which ought not be exceeded. Moreover, $SoC_m$ shall be the state of charge for which the battery has the lowest life expectancy. This depends on the respective design of the battery. In the case of lithium-ion batteries, the $SoC_m$ is for example typically between 60 and 80 percent (cf [2]).

Furthermore, the temperature profile ought not leave the permissible range of $T_{min}$ to $T_{max}$. This interval contains $T_{ref}$. In order to take account of formula (1) during the cost-optimum and service life-optimized planning of the usage of the battery, a preview horizon H is selected, which is typically 24 hours and is broken down into N suitable successive time intervals. The length of the n-th time interval is $\Delta t_n$. An electricity price prediction $K_n$ in euros per kilowatt hour is available for each of these time intervals.

The behavior of the energy system can be modeled using mixed integer linear programming (MILP) in order to minimize the cost expenditure.

MILP can be used to find solutions with a very good quality of results in a relatively short run time.

The steps of the MILP program can be carried out iteratively and the program can be aborted if a previously defined time limit or quality of results is reached.

The model described below should be regarded merely as one possible exemplary formulation and does not constitute a limitation for the method.

The state of charge and the temperature of the battery are expressed by the variables $SoC_n$ and $T_n$ for each time interval $n \in \{1,\ldots,N\}$. In order then to take account of the calendrical aging during the use of the battery, an additional battery cost variable $C_{Cal,n}:=F(SoC_n, T_n)*\Delta t_n$ is generated for each time interval and the sum $C_{Cal,1}+C_{Cal,2}+\ldots+C_{Cal,N}$ is added to the cost function. Each of these cost variables is subject to K linear conditions of the form $$C_{cal,n} \geq a_k + b_k*SoC_n + c_k*T_n, k \in \{1,\ldots,K\} \quad (2)$$

which ensure that the calendrical aging costs according to (1) are approximately simulated and taken into account in the cost calculation.

In order to achieve a sufficiently good approximation of the actual non-linear calendrical aging costs according to (1) with the linear formulation in accordance with (2), the following procedure is adopted according to embodiments of the invention: in order to linearize the above-explained non-linear relationship with two arguments (state of charge $SoC_n$ and temperature $T_n$), a logarithmic formulation is used:

Step 1: logarithmizing the calendrical aging costs according to (1):

Definition of the logarithmic calendrical aging costs per hour as:

$$L_{cal,n}:=\log(F(SoC_n,T_n))=\log(h(SoC_n))+\log(f(T_n))$$

and thus from (1):

$$F(SoC_n,T_n)=\exp(L_{cal,n}) \quad (3)$$

Figure 2:
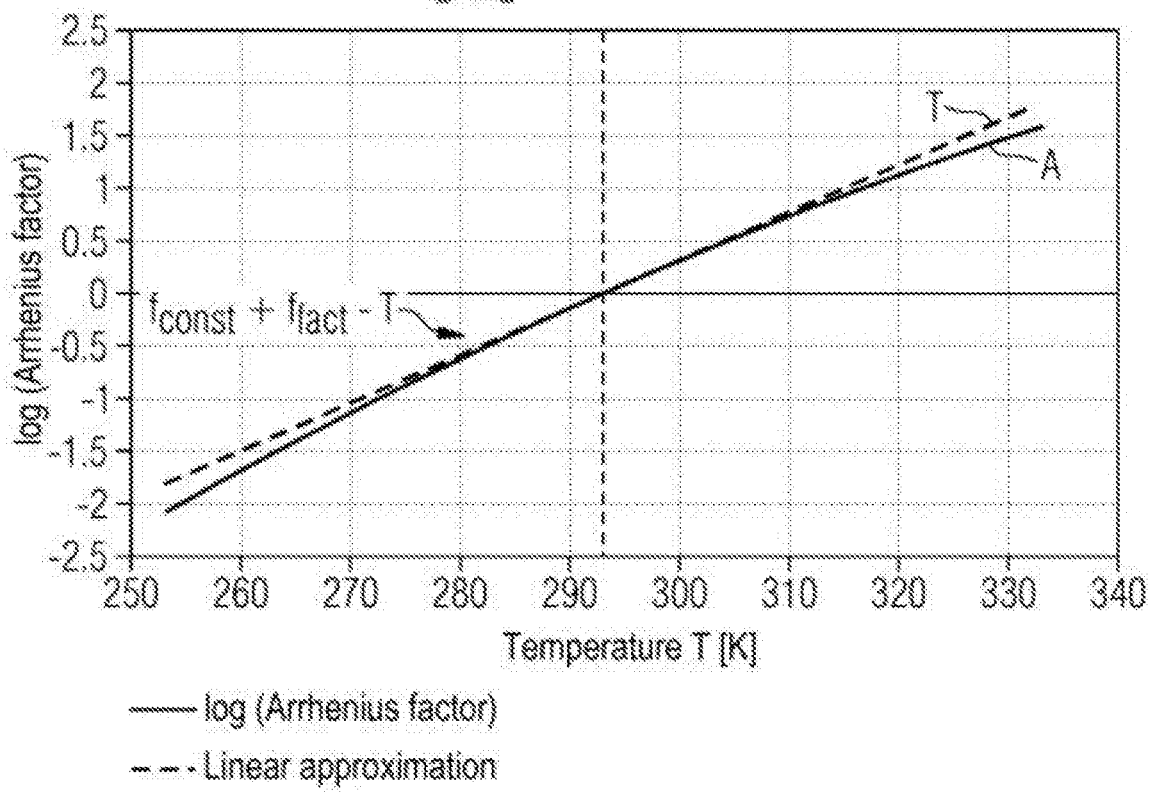
FIG. 2 shows the normalized, logarithmic Arrhenius law.

Step 2: linearizing the logarithmic calendrical aging costs per hour $L_{Cal,n}$:

Step 2a: linear approximation T of the function $\log(f(T_n))$ (see FIG. 2, reference sign A):

$$\log(f(T_n)) \approx f_{const} + f_{fact}*T_n \quad (4)$$

Step 2b: linear approximation of the function $\log(h(SoC_n))$:

$$\log(h(SoC_n))=\log(C_{Bat}/(365*24))-\log(g(SoC_n)) \quad (5)$$

Figure 5:
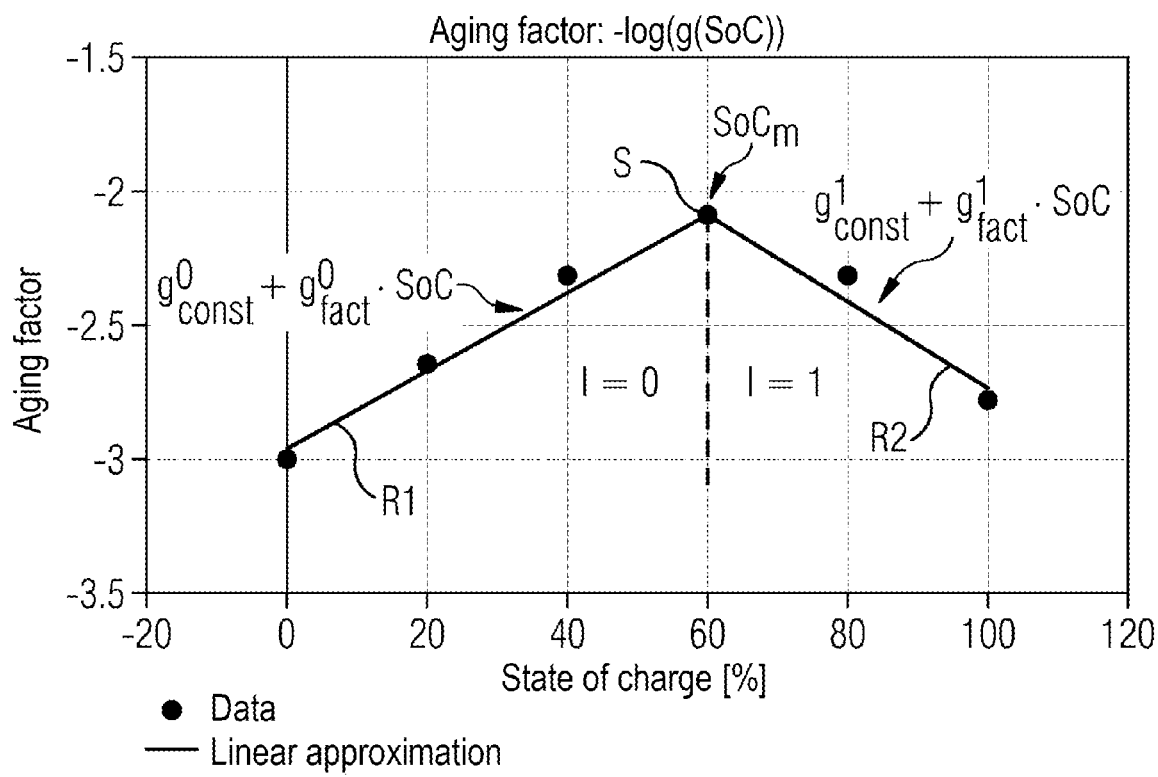
FIG. 5 shows the linear approximation of the aging factor with two straight lines R1 and R2.

Linear approximation of the aging factor $-\log(g(SoC))$ with two straight lines R1 and R2 (least squares with respect to the data points of $-\log(g(SoC))$), which each run through the point $[SoC_m, -\log(g(SoC_m))]$, also called support point S (see FIG. 5):

$$-\log(g(SoC_n)) \approx g_{0,const}+g_{0,fact}*SoC_n, \text{ if } SoC_n \leq SoC_m, \quad (6a)$$

$$-\log(g(SoC_n)) \approx g_{1,const}+g_{1,fact}*SoC_n, \text{ if } SoC_n > SoC_m \quad (6b)$$

Equation (6a) describes the calendrical aging for states of charge less than/equal to $SoC_m$, and equation (6b) describes that for states of charge greater than $SoC_m$. In the mixed integer linear program, with the aid of binary variables a decision is taken regarding which of these two states the battery is in.

Inserting the functions (6a) and (6b) into (5) yields directly:

$$\log(h(SoC_n)) \approx \log(C_{Bat}/(365*24)) + g_{0,const} + g_{0,fact}*SoC_n, \text{ if } SoC_n \leq SoC_m, \quad (7a)$$

$$\log(h(SoC_n)) \approx \log(C_{Bat}/(365*24)) + g_{1,const} + g_{1,fact}*SoC_n, \text{ if } SoC_n > SoC_m \quad (7b)$$

Consequently, it follows for the logarithmic aging costs per hour $L_{Cal,n}$ from (4), (5), (7a) and (7b) that:

$$L_{cal} \approx \log(C_{Bat}/(365*24)) + g_{const} + g_{fact}*SoC_n + f_{const} + f_{fact}*T_n, \text{ if } SoC_n \leq SoC_m, \quad (8a)$$

$$L_{cal} \approx \log(C_{Bat}/(365*24)) + g1_{const} + g_{fact}*SoC_n + f_{const} + f_{fact}*T_n, \text{ if } SoC_n > SoC_m \quad (8b)$$

If $SoC_m$ is very close to $SoC_{min}$ or $SoC_{max}$ (this depends on the design of the battery), then the function $-\log(g(SoC))$ is approximated only with one straight line instead of two. The binary decision variables in the mixed integer linear program and accordingly the case differentiations in formulae (6a), (6b), (7a), (7b) and (8a), (8b) can then be dispensed with.

Figure 6:
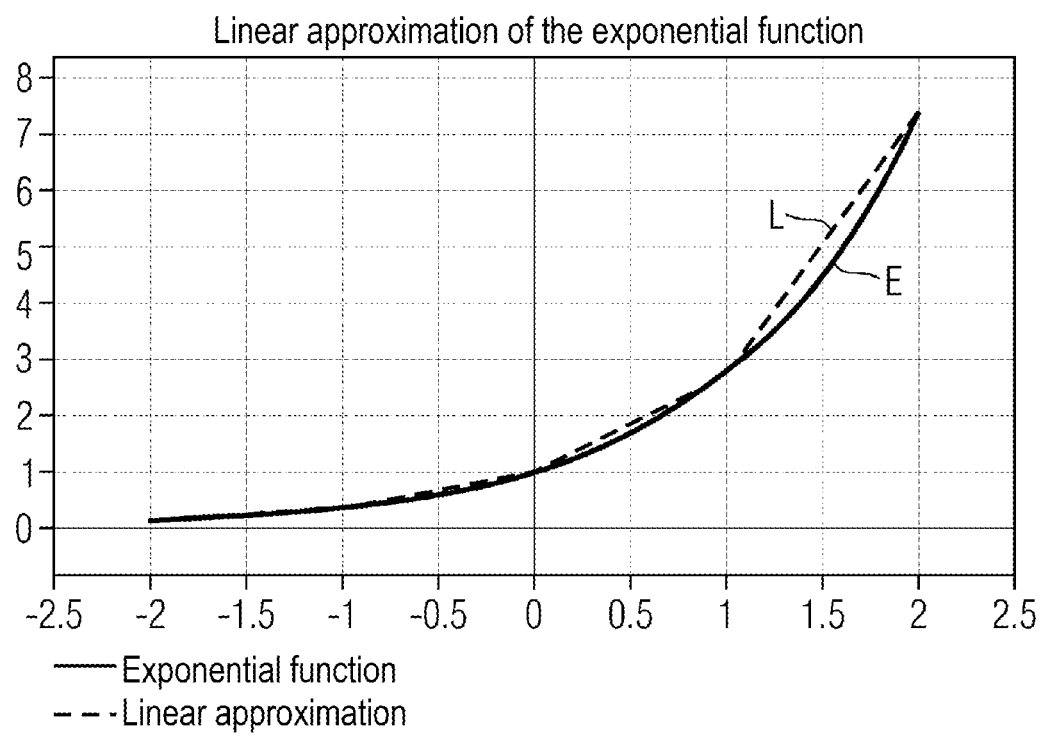
FIG. 6 shows the linear approximation L of the exponential function E with 4 linear segments.

Step 3: linear approximation L of the exponential function E in (3) with K straight lines (see FIG. 6):

The K straight lines (with displacement constants $s_k$ and rises $r_k$) for the linear approximation of the exponential function $F(SoC_n, T_n) = \exp(L_{Cal,n})$ result in the following inequalities (k=1, ..., K):

$$F(SoC_n, T_n) \geq S_k + r_k * L_{cal}, k \in \{1, \ldots, K\} \quad (9)$$

For the calendrical aging costs, the following results directly from (9)

$$C_{cal,n} = F(SoC_n, T_n) * \Delta t_n \geq s_k * \Delta t_n + r_k * \Delta t_n * L_{cal,n}, k \in \{1, \ldots, K\} \quad (10)$$

The linear approximation of the logarithmic aging costs per hour $L_{Cal,n}$ from formulae (8a) and (8b) can then be inserted into inequality (10). With the definition of the coefficients $a_k$, $b_k$ and $c_k$ for $k \in \{1, \ldots, K\}$:

$$a_k := s_k * \Delta t_n + r_k * \Delta t_n * [\log(C_{Bat}/(365*24)) + g_{0,const} + f_{const}], \text{ if } SoC_n \leq SoC_m,$$

$$a_k := s_k * \Delta t_n + r_k * \Delta t_n * [\log(C_{Bat}/(365*24)) + g_{1,const} + f_{const}], \text{ if } SoC_n > SoC_m,$$

$$b_k := r_k * \Delta t_n * g_{0,fact}, \text{ if } SoC_n \leq SoC_m,$$

$$b_k := r_k * \Delta t_n * g_{1,fact}, \text{ if } SoC_n > SoC_m,$$

$$c_K := r_K * \Delta t_n * f_{fact}$$

the result is the linear approximation of the calendrical aging costs $C_{Cal,n}$ in accordance with (2).

An example scenario which illustrates the consideration of calendrical aging costs in the planning of the battery usage in a greatly simplified smart grid application (smart (energy) grids=intelligent (electricity) grids) is described below, without being restricted to this example or this application. Cost- and energy-efficient operation is of great importance for smart energy grids.

Figure 3:
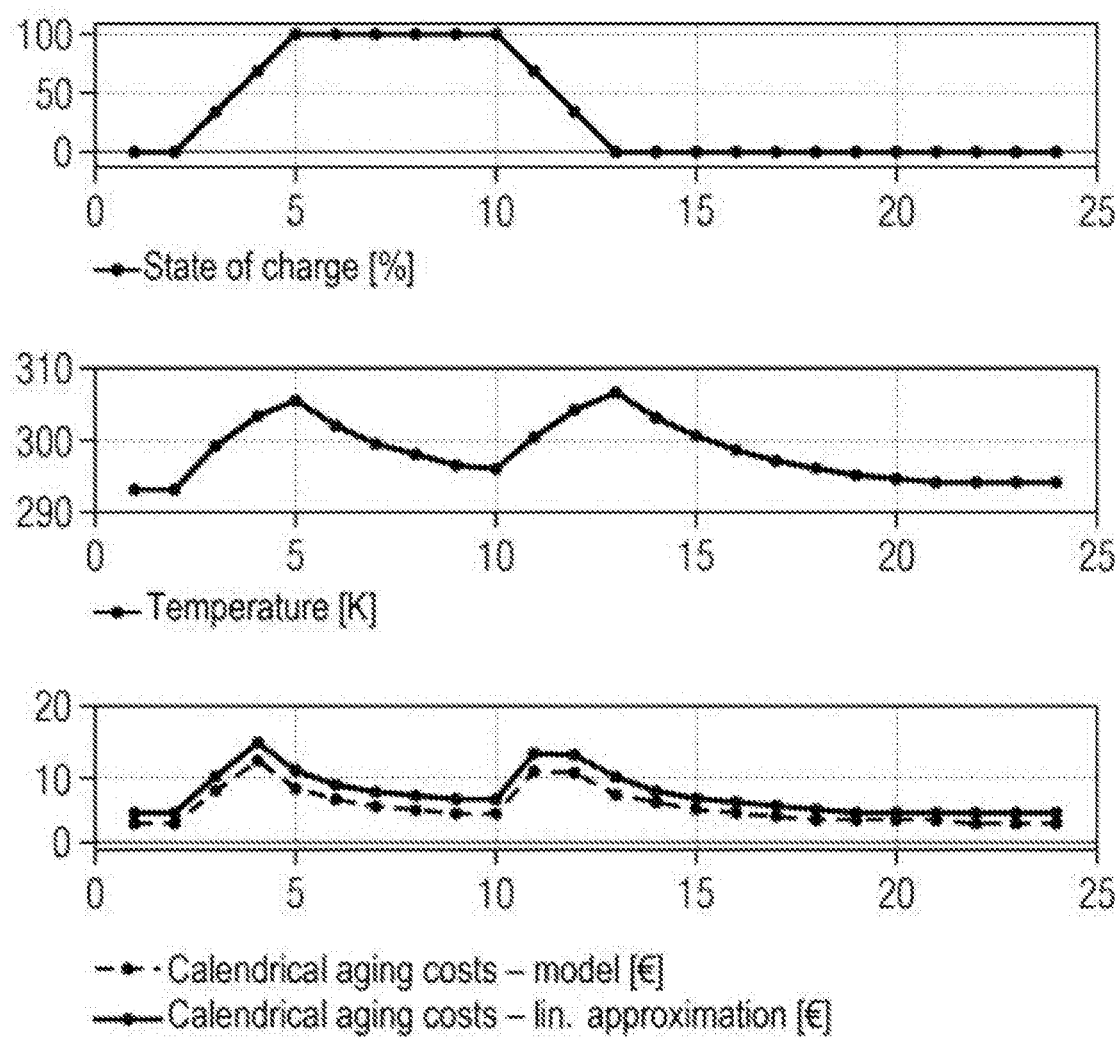
FIG. 3 shows three graphs with regard to power, state of charge of battery and network costs in an example scenario.
Figure 4:
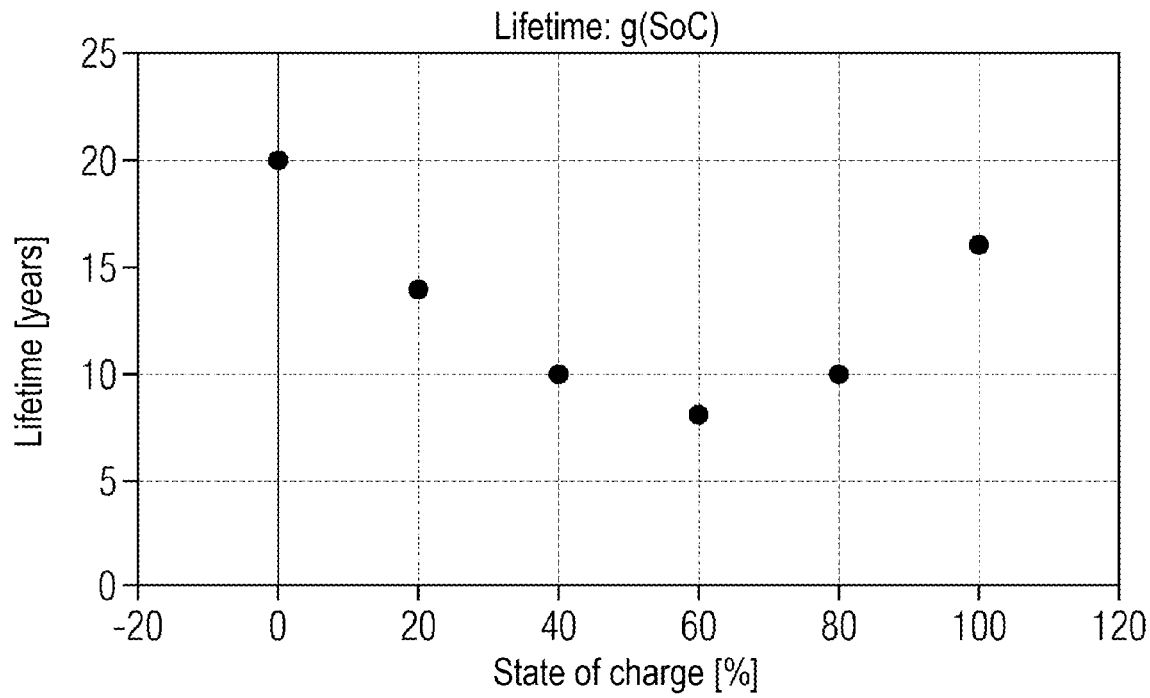
FIG. 4 shows the lifetime of the energy store as a function of the state of charge.
Figure 7:
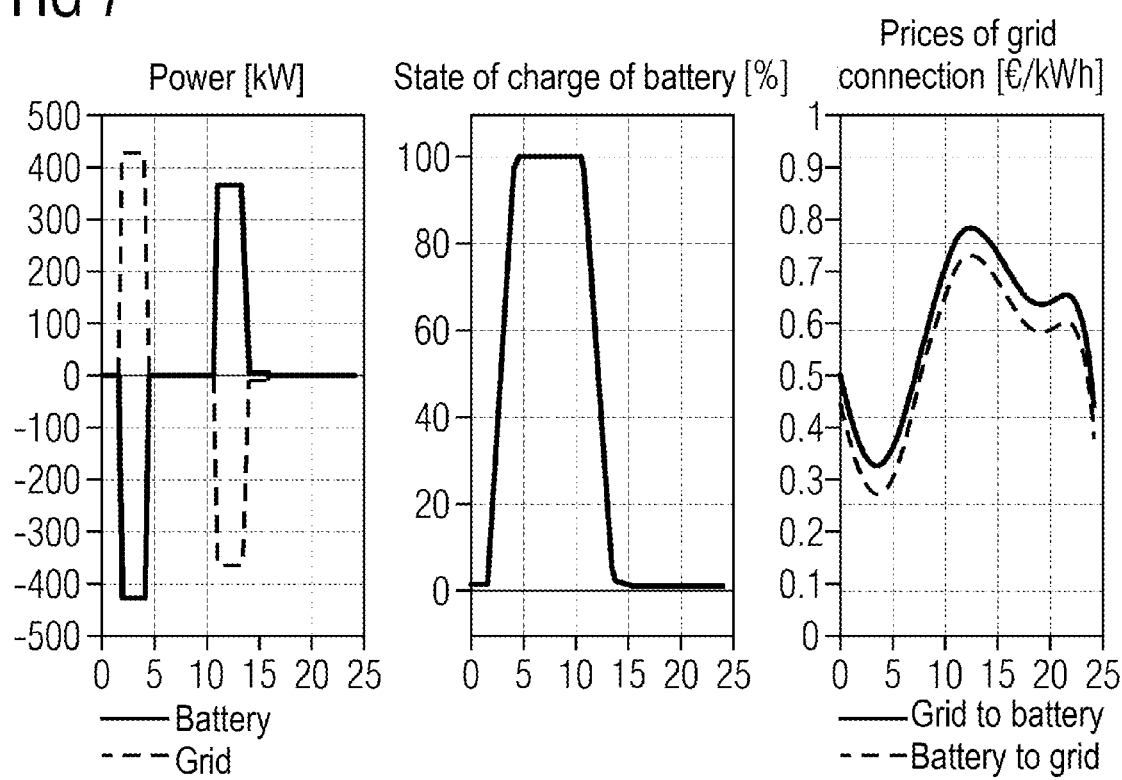
FIG. 7 shows three graphs as a function of state of charge, temperature and costs resulting from the calendrical aging, and the linear approximation thereof.

A time horizon of 24 hours is assumed, in which a battery connected to the power grid can draw energy from or feed energy into the grid. Costs become due or rewards are paid out for this. The assumed costs and rewards are illustrated as a time series in FIG. 7 (prices of the grid connection [€/kWh]). The energy during night-time hours is generally more favorable than energy during the day. The program exploits this fact for cost-optimum or service life-optimized control of the battery usage. During the night, the battery is charged with favorable power and it subsequently feeds power into the grid again if the reward for this is as high as possible (see FIG. 7 (power [kW], state of charge of battery [%])). Whether this procedure is economic depends on the ratio of the price differences for the energy and the resulting aging costs of the battery. FIG. 3 shows the corresponding state of charge, the temperature and the calendrical aging costs. The latter are illustrated as a comparison of the actual costs, on the basis of the non-linear model, and the costs calculated according to embodiments of the invention, on the basis of the linearized model. It is evident that the linear approximation always slightly overestimates the actual costs and in the process represents the underlying non-linear model qualitatively very well. The influence of state of charge and temperature on the calendrical aging costs can likewise be illustrated very well on the basis of the example scenario: during the charging of the battery in hours 2-5, the battery heats up and the costs rise. In hours 3 and 4, the battery has an average state of charge. Since it is fully charged by hour 5 and thus leaves the range of the average states of charge, which is costly for the calendrical aging, the costs fall from hour 4 to hour 5 even though the temperature rises. The same phenomenon can also be observed during the discharging of the battery from hour 12 to hour 13. When the battery is not used in hours 5-10 and hours 13-24, the costs fall on account of cooling.

Although embodiments of the invention has been specifically illustrated and described in detail by means of the preferred exemplary embodiment outlined, nevertheless embodiments of the invention is not restricted by the examples disclosed and other variations can be derived therefrom by the person skilled in the art, without departing from the scope of protection of embodiments of the invention.

The implementation of the processes or method sequences described above can be effected on the basis of instructions present on computer-readable storage media or in volatile computer memories (referred to in combination hereinafter as computer-readable memories). Computer-readable memories are for example volatile memories such as caches, buffers or RAM and non-volatile memories such as exchangeable data carriers, hard disks, etc.

The functions or steps described above can be present here in the form of at least one instruction set in/on a computer-readable memory. In this case, the functions or steps are not tied to a specific instruction set or to a specific form of instruction sets or to a specific storage medium or to a specific processor or to specific execution schemes and can be implemented by software, firmware, microcode, hardware, processors, integrated circuits, etc. in standalone operation or in arbitrary combination. In this case, a wide variety of processing strategies can be employed, for example serial processing by a single processor or multi-processing or multitasking or parallel processing, etc.

The instructions can be stored in local memories, but it is also possible to store the instructions on a remote system and access them via a network.

The term "processor", "central signal processing", "control unit" or "data evaluation means", as used here, encompasses processing means in the broadest sense, that is to say for example servers, general purpose processors, graphics processing units, digital signal processors, application-specific integrated circuits (ASICs), programmable logic circuits such as FPGAs, discrete analog or digital circuits and arbitrary combinations thereof, including all other processing means that are known to the person skilled in the art or will be developed in the future. In this case, processors can consist of one or a plurality of devices or apparatuses or units. If a processor consists of a plurality of devices, the latter can be designed or configured for the parallel or sequential processing or execution of instructions.

Although the invention has been illustrated and described in greater detail with reference to the preferred exemplary embodiment, the invention is not limited to the examples disclosed, and further variations can be inferred by a person skilled in the art, without departing from the scope of protection of the invention.

For the sake of clarity, it is to be understood that the use of "a" or "an" throughout this application does not exclude a plurality, and "comprising" does not exclude other steps or elements.

The invention claimed is:

1. A method for a service life-optimized usage of an electrochemical energy store within a predefinable usage planning period, wherein a calendrical aging constitutes a variable which influences a service life of the electrochemical energy store and which is expressed in a form of a non-linear function depending on a state of charge and a temperature of the electrochemical energy store, which are able to be influenced by at least one charging and/or discharging process, the method comprising:
   a) forming a logarithm of a non-linear function for determining the calendrical aging;
   b) converting the logarithmic function formed, which is dependent on arguments of the state of charge and the temperature, into an addition of a first logarithmic term, which is dependent on the state of charge, and a second logarithmic term, which is dependent on the temperature;
   c) linearly approximating, in each case independently of one another, both logarithmic terms in each of the time steps which are predefinable for the purpose of subdividing a usage planning period; and
   d) calculating the non-linear function for determining the calendrical aging by applying an exponential function to the logarithm from step a);
   wherein steps a)-d) yield a calculation of the calendrical aging for the service life-optimized usage planning by means of a sum over the predefinable time steps.

2. The method as claimed in claim 1, wherein the exponential function is piecewise linearly approximated.

3. The method as claimed in claim 1, wherein a number of segments for the linear approximation is defined.

4. The method as claimed in claim 1, wherein the first logarithmic term dependent on the state of charge is piecewise linearly approximated.

5. The method as claimed in claim 1, wherein a state of charge of extremely fast calendrical aging is determined, which is used as a support point for the piecewise linear approximation.

6. The method as claimed in claim 1, wherein the second logarithmic term dependent on the temperature is piecewise linearly approximated.

7. The method as claimed in claim 1, wherein a minimum and/or maximum state of charge of the energy store influence(s) the calculation as further variables, further wherein these variables as threshold values ought not be undershot and/or exceeded.

8. The method as claimed in claim 1, wherein a minimum and/or maximum temperature of the energy store influence(s) the calculation as further variables, further wherein these variables as threshold values ought not be undershot and/or exceeded.

9. The method as claimed in claim 1, wherein the usage planning for the service life-optimized usage is determined by calculation by integer linear programming.

10. The method as claimed in claim 1, wherein the cyclic aging is used as a further variable for determining the usage planning for the service life-optimized usage of the energy store.

11. The device as claimed in claim 1, wherein the exponential function from feature d) is piecewise linearly approximable.

12. The device as claimed in claim 1, wherein a number of segments for the linear approximation is definable.

13. The device as claimed in claim 1, wherein the first logarithmic term dependent on the state of charge is piecewise linearly approximable.

14. The device as claimed in claim 1, wherein a state of charge of extremely fast calendrical aging is determinable, which can be used as a support point for the piecewise linear approximation.

15. The device as claimed in claim 1, wherein the second logarithmic term dependent on the temperature is piecewise linearly approximableapproximable.

16. The device as claimed in claim 1, wherein a minimum and/or maximum state of charge of the energy store influence(s) the calculation as further variables, wherein these variables as threshold values ought not be undershot and/or exceeded.

17. The device as claimed in claim 1, wherein a minimum and/or maximum temperature of the energy store influence(s) the calculation as further variables, wherein these variables as threshold values ought not be undershot and/or exceeded.

18. The device as claimed in claim 1, wherein the usage planning for the service life-optimized usage is determinable by calculation by integer linear programming.

19. The device as claimed in claim 1, wherein the cyclic aging can be used as a further variable for determining the usage planning for the service life-optimized usage of the energy store.

20. A computer program comprising means for carrying out the method as claimed in claim 1 when the computer program is executed on a device or in means of the device.

21. A device for determining a service life-optimized usage of an electrochemical energy store within a predefinable usage planning period, wherein a calendrical aging constitutes a variable which influences a service life of the electrochemical energy store and which can be expressed in a form of a non-linear function depending on a state of charge and a temperature of the electrochemical energy store, which are able to be influenced by at least one charging and/or discharging process, wherein the device is configured to:
   a) form a logarithm of the non-linear function for determining the calendrical aging,
   b) wherein the logarithmic function formed, which is dependent on arguments of the state of charge and the temperature, can be converted into an addition of a first logarithmic term, which is dependent on the state of charge, and a second logarithmic term, which is dependent on the temperature,
   c) wherein both logarithmic terms are linearly approximable, in each case independently of one another, in each of the time steps which are predefinable for the purpose of subdividing a usage planning period,
   d) wherein the non-linear function for determining the calendrical aging is calculable by applying an exponential function to the logarithm from feature a), e) wherein a calculation of the calendrical aging for the service life-optimized usage planning is able to be carried out by means of a sum over the predefinable time steps.

22. A computer-readable medium comprising instructions which, when executed on a suitable processing unit or the device or in one or more means of the device as claimed in claim 21, cause the computer or the device or the means to carry out the method.

* * * * *